United States Patent
Morimoto et al.

(10) Patent No.: US 10,191,336 B2
(45) Date of Patent: Jan. 29, 2019

(54) LIQUID CRYSTAL DISPLAY DEVICE THAT AVOIDS INFLUENCE ON IMAGE QUALITY DUE TO RESIDUAL IONS

(71) Applicant: Japan Display Inc., Tokyo (JP)

(72) Inventors: Masateru Morimoto, Tokyo (JP); Michiaki Sakamoto, Tokyo (JP); Takeshi Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/784,505

(22) Filed: Oct. 16, 2017

(65) Prior Publication Data

US 2018/0129104 A1    May 10, 2018

(30) Foreign Application Priority Data

Nov. 10, 2016    (JP) .................. 2016-219682

(51) Int. Cl.
| | |
|---|---|
| *G02F 1/1343* | (2006.01) |
| *G02F 1/1333* | (2006.01) |
| *G02F 1/1362* | (2006.01) |
| *G02F 1/1368* | (2006.01) |
| *H01L 27/12* | (2006.01) |
| *H01L 29/786* | (2006.01) |

(52) U.S. Cl.
CPC ...... *G02F 1/134309* (2013.01); *G02F 1/1362* (2013.01); *G02F 1/1368* (2013.01); *G02F 1/133345* (2013.01); *G02F 1/136227* (2013.01); *G02F 1/136286* (2013.01); *H01L 27/124* (2013.01); *G02F 2001/13685* (2013.01); *G02F 2001/133397* (2013.01); *G02F 2001/134372* (2013.01); *G02F 2001/136218* (2013.01); *G02F 2001/136295* (2013.01); *G02F 2201/122* (2013.01); *G02F 2201/123* (2013.01); *G02F 2202/104* (2013.01); *H01L 29/78669* (2013.01); *H01L 29/78675* (2013.01)

(58) Field of Classification Search
CPC ............ H01L 27/3244; H01L 27/1251; H01L 29/66742
See application file for complete search history.

(56) References Cited

U.S. PATENT DOCUMENTS 9,910,523 B2 *    3/2018    Kim ...................... G06F 3/0412
2015/0301381 A1    10/2015    Okita

FOREIGN PATENT DOCUMENTS

| JP | 2008-3251 A | 1/2008 |
|---|---|---|
| JP | 2015-206830 A | 11/2015 |

\* cited by examiner

*Primary Examiner* — Quoc Hoang
(74) *Attorney, Agent, or Firm* — Typha IP LLC

(57) ABSTRACT

The purpose of the invention is to suppress image persistence. The structure if the invention is as follows: A liquid crystal display device comprising: scanning lines extending in a first direction and arranged in a second direction, video signal lines arranged to cross the scanning lines, a pixel area is surrounded by the scanning lines and the video signal lines, a pixel electrode is formed in the pixel area, wherein conductive wirings are formed over the video signal lines via an organic insulating film in a plan view in the display area where images are displayed, a width in the first direction of the conductive wiring is bigger than a width in the first direction of the video signal line, an amount that the conductive wiring protrude the video signal line in a plan view is essentially the same in both side of the video signal line.

13 Claims, 14 Drawing Sheets

LIQUID CRYSTAL DISPLAY DEVICE THAT AVOIDS INFLUENCE ON IMAGE QUALITY DUE TO RESIDUAL IONS

CLAIM OF PRIORITY

The present application claims priority from Japanese Patent Application JP 2016-219682 filed on Nov. 10, 2016, the content of which is hereby incorporated by reference into this application.

BACKGROUND OF THE INVENTION

(1) Field of the Invention

The present invention relates to a liquid crystal display device that measures image persistence due to ions.

(2) Description of the Related Art

A liquid crystal display device comprises a TFT substrate where thin film transistors (TFT) and pixel electrodes are formed and a counter substrate opposing to the TFT substrate, wherein a liquid crystal layer is sandwiched between the TFT substrate and the counter substrate. Images are formed by controlling the transmittance of light in each of pixels.

Scanning lines extend in lateral direction and arranged in longitudinal direction, while image signal lines extend in longitudinal direction and arranged in lateral direction; wherein a pixel is formed in an area surrounded by the scanning lines and the image signal lines. A pixel electrode in the pixel connects with the image signal line through a TFT and through holes. Image signals are supplied to the video signal lines according to scanning signals. The pixel electrode tends to have cross talk with the video signal line and the scanning line in a vicinity of the through hole. Patent document 1 (Japanese patent laid open 2008-3251) discloses to surround the periphery of the through hole by a common electrode.

Recently a liquid crystal display device that the function of touch panel is built in has been developed. This kind of liquid crystal display device, for example, comprises: first electrodes for a touch panel is formed on outer side of the counter substrate; and second electrodes for the touch panel are formed by partitioning the common electrode in the TFT substrate. Patent document 2 (Japanese patent laid open 2015-206830) discloses, for example, to form the first electrodes extending in a same direction as the scanning lines on outer side of the counter substrate, and to form the second electrodes by partitioning the common electrode above certain image signal lines. In this case, auxiliary electrodes are formed on the common electrode above and along other image signal lines.

SUMMARY OF THE INVENTION

Sometimes a liquid crystal display device does not display correct images after the same image is displayed for a long time depending on certain images. For example, when a stripe pattern is displayed for a long time, a black non uniformity appears at the place of the border between the stripes even after the image signals are changed. This phenomenon of non-uniformity of display is called the image persistence or the after image. This image persistence is caused by ions. The image persistence disappears after certain time duration; however, it deteriorates the images until the image persistence disappears.

The purpose of the present invention is to prevent the image persistence, thus realizes a liquid crystal display device having high quality image display.

The structures to realize the above purpose are as follows.

(1) A liquid crystal display device comprising: scanning lines extending in a first direction and arranged in a second direction, videos signal lines arranged to cross the scanning lines, a pixel area is surrounded by the scanning lines and the video signal lines, a pixel electrode is formed in the pixel area, wherein conductive wirings are formed over the video signal lines via an organic insulating film in a plan view in the display area where images are displayed, a width in the first direction of the conductive wiring is bigger than a width in the first direction of the video signal line, an amount that the conductive wiring protrude the video signal line in a plan view is essentially the same in both sides of the video signal line.

(2) A liquid crystal display device comprising: scanning lines extending in a first direction and arranged in a second direction, a first videos signal line and a second video signal line arranged to cross the scanning lines, a pixel is formed between the first video signal line and the second video signal line, a pixel electrode is formed in the pixel, wherein a first shield wiring is formed above the first video signal line via a first insulating film, a second shield wiring is formed above the second video signal line via a first insulating film, the pixel electrode has driving area to drive liquid crystal and a contact area to contact with a TFT, the pixel includes a first area including the driving area of the pixel electrode, and a second area including the contact area of the pixel electrode, in the second area, the distance between the pixel electrode and the first shield wiring is d1, the distance between the pixel electrode and the second shield wiring is d2, wherein the difference between d1 and d2 is 2 μm or less.

(3) A liquid crystal display device comprising: scanning lines extending in a first direction and arranged in a second direction, a first videos signal line and a second video signal line arranged to cross the scanning lines, a pixel is formed between the first video signal line and the second video signal line, a pixel electrode is formed in the pixel, wherein a first shield wiring is formed above the first video signal line via a first insulating film, a second shield wiring is formed above the second video signal line via a first insulating film, the pixel electrode has driving area to drive liquid crystal and a contact area to contact with a TFT, the pixel includes a first area including the driving area of the pixel electrode, and a second area including the contact area of the pixel electrode, in the second area, the distance between the pixel electrode and the first shield wiring is d1, the distance between the pixel electrode and the second shield wiring is d2, wherein in a first pixel row, the pixels are arranged in the first direction, an amount of d2−d1 is 1.5 μm or more in whole pixels in the first pixel row.

DETAILED DESCRIPTION OF THE PREFERRED EMBODIMENTS

The present invention is explained in detail by embodiments.

First Embodiment

Figure 1:
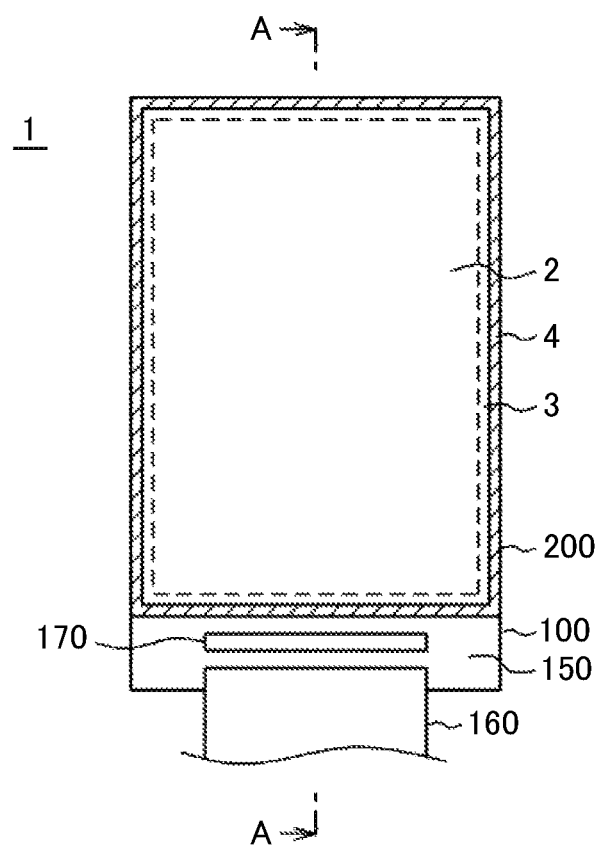
FIG. 1 is a cross sectional view of the liquid crystal display device that the present invention is applied.
Figure 2:
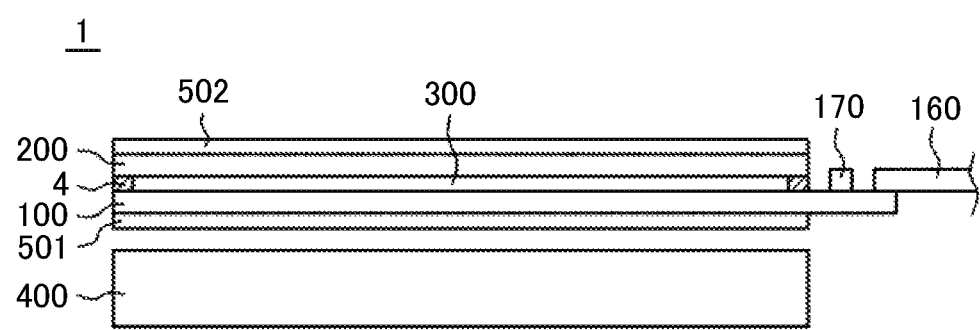
FIG. 2 is a cross-sectional view of FIG. 1 along the line A-A.

FIG. 1 is an example of a liquid crystal display device used e.g. in a cellar phone. FIG. 2 is a cross-sectional view along the line A-A of FIG. 1. In FIGS. 1 and 2, the TFT substrate 100 and the counter substrate 200 adhere to each other by the seal material 4; the liquid crystal 300 is sandwiched between the TFT substrate 100 and the counter substrate 200. The lower polarizing plate 501 is adhered to underneath the TFT substrate 100; the upper polarizing plate 502 is adhered to on the counter substrate 200. Since the liquid crystal is not self-illuminant, a back light is set on the back of the liquid crystal display panel.

The display area 2 is formed where the TFT substrate 100 and the counter substrate 200 overlap each other in a plan view; the area around the display area is the peripheral area 3. The seal material 4 is formed at the peripheral area to adhere the TFT substrate 100 and the counter substrate 200. The TFT substrate 100 is formed bigger than the counter substrate 200; the area the TFT substrate 100 doesn't overlap with the counter substrate is the terminal area 150. The driver IC 170 is installed on the terminal area, and the flexible wiring substrate 160 to supply signals and power is connected to the terminal area 150.

Generally, improvement of viewing angle characteristics is desired in the liquid crystal display device. IPS (In Plane Switching) method has superior viewing angle characteristics in that a transmittance of a pixel is controlled by rotating liquid crystal molecules in a plane. There are several types in IPS method, however, the structure that comb like or stripe like pixel electrodes are formed over a planar shaped common electrode via an insulating film can increase a transmittance, this, this structure is in a main stream.

Figure 3:
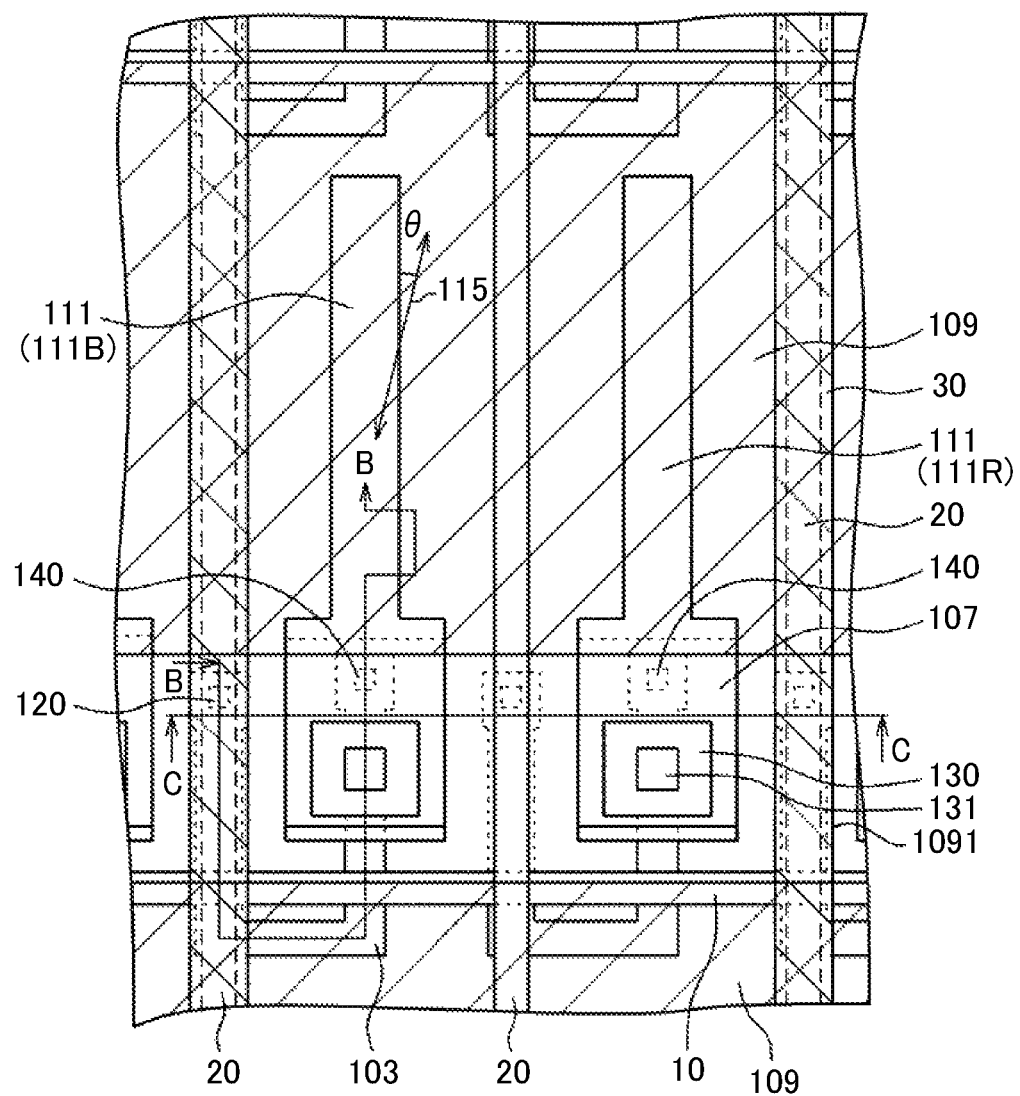
FIG. 3 is a plan view of the pixel structure of the liquid crystal display device.

FIG. 3 is a plan view that shows two pixels of the above explained IPS method liquid crystal display device. The left hand side pixel is for a blue color pixel while the right hand side pixel is for a red color pixel. A green color pixel is formed in the left of the blue color pixel and in the right of the red color pixel; a set of the blue color pixel, the red color pixel and the green color pixel is repeated from left to right in the display area. In FIG. 3, the scanning lines 10 extend in lateral direction and are arranged in longitudinal direction in a first pitch. The pitch of the scanning lines constitutes a longitudinal size of the pixel. The video signal lines 20 extend in longitudinal direction and are arranged in lateral direction in a second pitch. The pitch of the video signal lines constitutes a lateral size of the pixel.

The stripe shaped pixel electrode 111 (111B, 111R) extends in longitudinal direction. Since the lateral pitch of the pixels in FIG. 3 is 30 μm or less, the pixel electrode is one stripe shaped, however, if the pitch of the pixels becomes bigger, the pixel electrode 111 can be a comb like shape having a slit. Further the edge of the line shaped pixel electrode can be bent to avoid disinclination due to domains.

Video signals are supplied to the pixel electrode 111 from the video signal lines 20 via the TFTs and the through holes. In FIG. 3, the semiconductor layer 103 is connected to the video signal line 20 via the through hole 120. The semiconductor layer 103 is formed along and under the video signal line 20, crosses under the scanning line 10; then bends to cross under the scanning line 10 again; and connects with the pixel electrode 111 via through holes 140, 130 and 131. When the semiconductor layer 103 goes through under the scanning line 10, the TFT is formed. In this case, the scanning line 10 works as the gate electrode. Thus, in FIG. 3, there are two TFTs between the video signal line 20 and the pixel electrode 111, which is called a double gate TFT.

The direction of the alignment axis 115 in the alignment film has an angle θ with the direction of the pixel electrode 111 extends. The reason for the angle θ is to determine the rotating direction of the liquid crystal molecules when a voltage is applied to the pixel electrode 111. The angle θ is 5 degree to 15 degree, preferably 7 degree to 10 degree. In the meantime, in the other liquid crystal display devices, the direction of the alignment axis 115 in the alignment film is in a longitudinal direction of FIG. 3, and the direction of the pixel electrode 111 extends has an angle θ with the longitudinal direction of FIG. 3. The dielectric anisotropy is positive in FIG. 3. When the dielectric anisotropy is negative, the direction of the alignment axis 115 rotates 90 degree compared with the case of FIG. 3.

The common electrode 109 has an opening at the area of the through hole 130. The reason is to maintain the connection area between the pixel electrode 111 and the contact electrode. The opening is made in an individual pixel in a low definition display. However, since the opening is formed around the through hole 130, in a high definition display where an area of the pixel is small, the opening of the common electrode is continuously formed in plural pixels in common in lateral direction, not in an individual pixel. FIG. 3 is the case of the high definition displays.

In FIG. 3, on the left of the left pixel and on the right of the right pixel, common metal wiring 30 is formed overlapping the video signal line 20 in a plan view. The common metal wiring 30 is laminated on the common electrode 109 and electrically connects with the common electrode 109. The common metal wiring is e.g. a laminated structure of Mo—Al—Mo. The Mo (Molybdenum) means Mo alloy is also included; The Al (Aluminum) means Al alloy is also included. The common electrode 109 is formed by a transparent conductive layer like ITO (Indium Tin Oxide, hereinafter it may be called as the first ITO); however the transparent conductive layer like ITO has a high electrical resistance. Thus, the common metal wiring 30 is laminated on the common electrode 109 to decrease the electrical resistance of the common electrode 109 in total. In the meantime, the common metal wiring 30 is not formed over the video signal line between the left pixel and the right pixel in FIG. 3.

Figure 4:
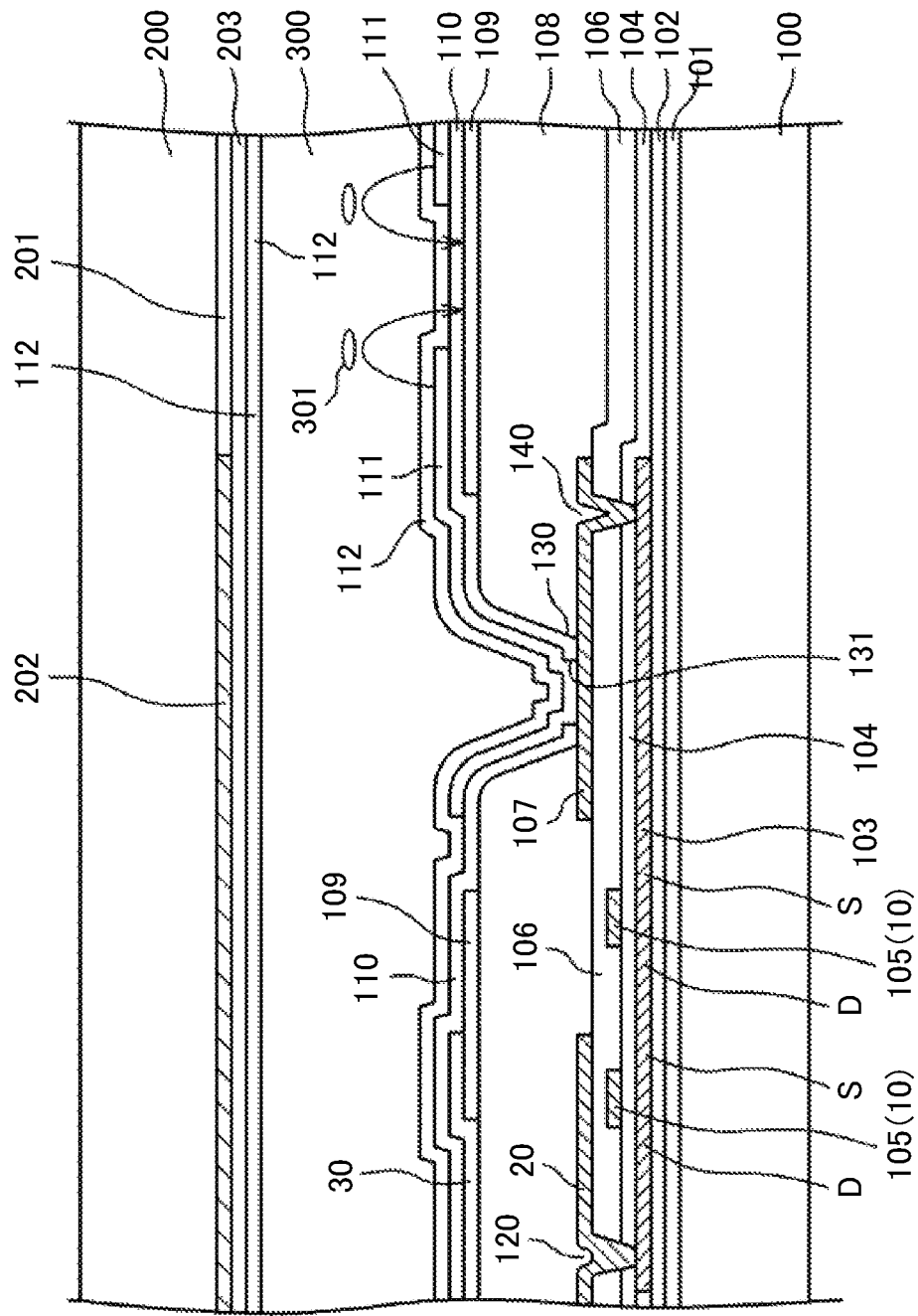
FIG. 4 is a cross sectional view of the display area of the liquid crystal display device.

FIG. 4 is a cross sectional view along the line B-B of FIG. 3. The TFT in FIG. 3 is a so called top gate type TFT; LTPS (Low Temperature Poly-Si) is used as a semiconductor layer. In the meanwhile, a-Si semiconductor is often used for a so called bottom gate type TFT. The cases of the top gate type TFT are explained in the following examples; however the present invention is applicable to the cases when the bottom gate TFT is used.

In FIG. 4, the first undercoat 101 of SiN and the second undercoat 102 of SiO are formed by CVD on the TFT substrate 100. The role of the first undercoat 101 and the second undercoat 102 is to prevent the semiconductor layer 103 from being contaminated by the impurity of the glass substrate 100. By the way, in this specification, SiN means Silicon Nitride and SiO means Silicon Oxide.

The semiconductor layer 103 is formed on the second undercoat 102. The semiconductor layer 103 is formed as that: a-Si layer is formed on the second undercoat 102 by CVD, then laser anneal is performed to transform the a-Si layer to the poly-Si layer. The poly-Si layer is patterned by photolithography.

The gate insulating film is formed on the semiconductor layer 103. The gate insulating film 103 is a $SiO_2$ film formed by CVD using TEOS (Tetraethyl orthosilicate) as material. The gate electrode 105 is formed on the gate insulating film 104. The scanning line 10 works as a gate electrode 105. The gate electrode 105 is formed by e.g. MoW film. If an electrical resistance of the gate electrode 105 or the scanning line 10 must be low, Al alloy is used.

After that, the interlayer insulating film 106 is formed to cover the gate insulating film 104. The interlayer insulating film 106 is to insulate the gate electrode 105 and the contact electrode 107. The semiconductor layer 103 connects with the video signal line 20 via the through hole 120 formed in the interlayer insulating film 106 and the gate insulating film 104. The contact hole 140 is formed in the interlayer insulating film 106 and the gate insulating film 104 to connect the source S of the TFT and the contact electrode 107. The contact holes 120 and 140 in the interlayer insulating film 106 and the gate insulating film 104 are formed simultaneously.

The contact electrode 107 is formed on the interlayer insulating film 106. As depicted in FIGS. 3 and 4, the semiconductor layer goes along and under the video signal line 20 and crosses under the scanning line 10 (the gate electrode 105) twice, where TFT's are formed. Namely, the source S and the drain D are formed to sandwich the gate electrode 105 in a plan view. The contact electrode 107 connects with the semiconductor layer 103 via through hole 140 formed in the interlayer insulating film 106 and the gate insulating film 104.

The contact electrode 107 and the video signal line 20 are formed simultaneously on the same layer. For example, Ti—Al—Ti is used for the contact electrode 107 and the video signal line 20 to decrease the electrical resistance. In this case Al also means Al alloy as AlSi.

The organic passivation film 108 is formed to cover the contact electrode 107, the video signal lines 20, and the interlayer insulating film 106. The organic passivation film 108 is formed by photo sensitive acrylic. The organic passivation film 108 can also be formed by silicone resin, epoxy resin or poly imide resin. Since the organic passivation film 108 has a role of flattening film, it is made thick. The thickness of the organic passivation film 108 is 1-4 μm and in many cases 2-3 μm.

The contact hole 130 in the organic passivation film 108 and the contact hole 131 in the capacitive insulating film 110, which are explained later are formed to connect the pixel electrode 111 and the contact electrode 107. Photo sensitive resin is formed for the organic passivation film 108. After coating the photo sensitive resin, it is exposed to light, then the exposed portion solves in a certain developer. Therefore, forming of the photo resist can be eliminated by using the photo sensitive material. After the baking in 230° C., the organic passivation film 108 is completed.

After that, the first ITO 40, which is to be the common electrode 109, is formed by sputtering, then the first TTO 40 is patterned and is eliminated from the contact hole 130 and the surroundings of the contact hole 130. The common electrode 109 can be formed in common for plural pixels in planar shape.

The SiN film, which is to be the capacitive insulating film, is formed on all the display area by CVD. After that the contact hole 131 in the capacitive insulating film 110 is formed in the through hole 130 to connect the contact electrode 107 and the pixel electrode 111.

After that the second ITO 50 is deposited by sputtering; and the second ITO is patterned to form the pixel electrode 111. The material for the alignment film is coated on the pixel electrodes 111 by flexographic printing or by ink jet; then the material is baked to form the alignment film 112. A rubbing method or a photo alignment method using polarized Ultra Violet light is used for alignment process of the alignment film 112.

When a voltage is applied between the pixel electrode 111 and the common electrode 109, a line of force is generated as depicted in FIG. 4. The field rotates the liquid crystal molecules 301; thus, the amount of light, transmitting each of the pixels, is controlled to make an image in the screen.

In FIG. 4, the counter substrate 200 is set opposing to the TFT substrate 100 with sandwiching the liquid crystal layer 300. The color filter 201 is formed on the inside of the counter substrate 200. The color filter 201 has a red color, a green color and a blue color according to the pixel, thus, color images are formed. The black matrix 202 is formed between the color filter 201 and the color filter 201. The black matrix works as a light shielding film; and further, actually has roles as: preventing light mixtures between the pixels, preventing photo currents in the TFT's, and preventing light reflections from the scanning lines 10 and the image signal lines 20.

The overcoat film 203 is formed to cover the color filter 201 and the black matrix 202. The surface of the layer formed by the color filter 201 and the black matrix 202 is rough, thus, the overcoat film 203 is used for a smooth surface. The alignment film 112 is formed on the overcoat film 203 to determine the initial alignment direction of the liquid crystal molecules 301. As in the case of the alignment film 112 of the TFT substrate, a rubbing method or a photo alignment method using polarized Ultra Violet light is used for the aligning process of the alignment film 112 of the counter substrate 200.

The above explained structure is only an example; the structure is modified according to the products. For example, there could be an inorganic passivation layer between the organic passivation film 108 and the contact electrode 107 or the image signal lines 20 on the TFT substrate 100.

Figure 5:
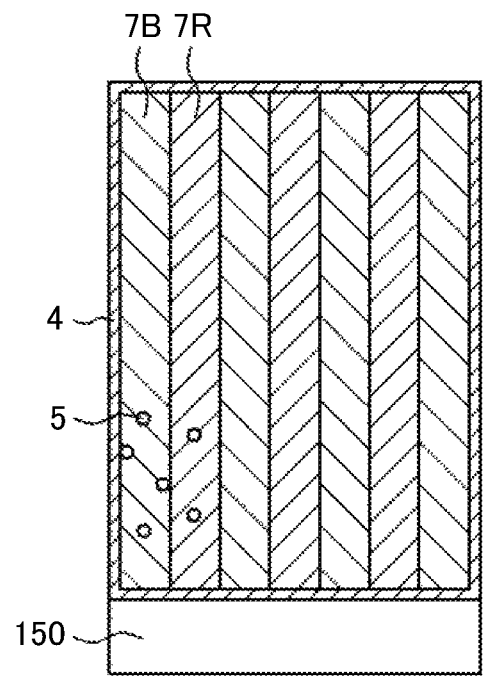
FIG. 5 is an example of stripe patterns.
Figure 6:
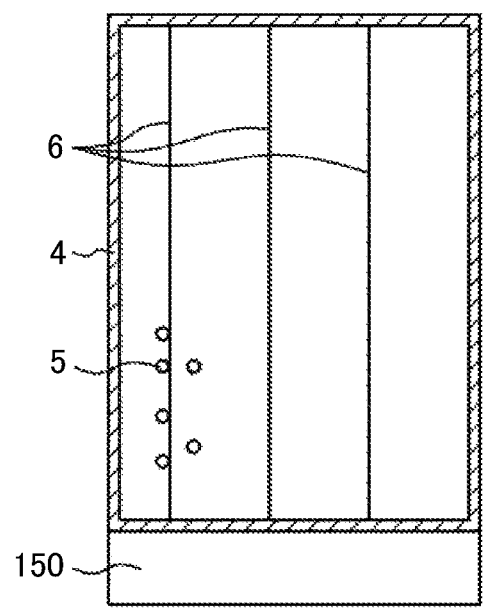
FIG. 6 is an example of the image persistence.

FIGS. 5 and 6 are plan views to show the phenomenon of the image persistence in the above explained liquid crystal display device. FIG. 5 shows the display area is divided into 7 areas to form the blue stripe 7B and the red stripe 7R, which are formed alternatively. In FIG. 5, there are many red pixel columns, green pixel columns and blue pixel columns in the blue stripe 7B, however, only the blues pixel columns are ON state. As the same token, there are many red pixel columns, green pixel columns and blue pixel columns in the red stripe 7R; however, only the red pixel columns are ON state.

The image persistence pattern 6 of longitudinal lines occurs when white solid display or one color solid display is displayed after displaying the image of FIG. 5 for a certain time. This image persistence pattern 6 of longitudinal stripe occurs at the boundary between the blue stripe 7B and the red stripe 7R. The inventors found that the image persistence pattern 6 is caused by gathering of ions 5, which are contained in the liquid crystal as ionic impurities. In this embodiment, it is characterized in that the gathering of ions occurs at the boundary where the blue stripe 7B is left and the red stripe 7R is right.

Figure 7:
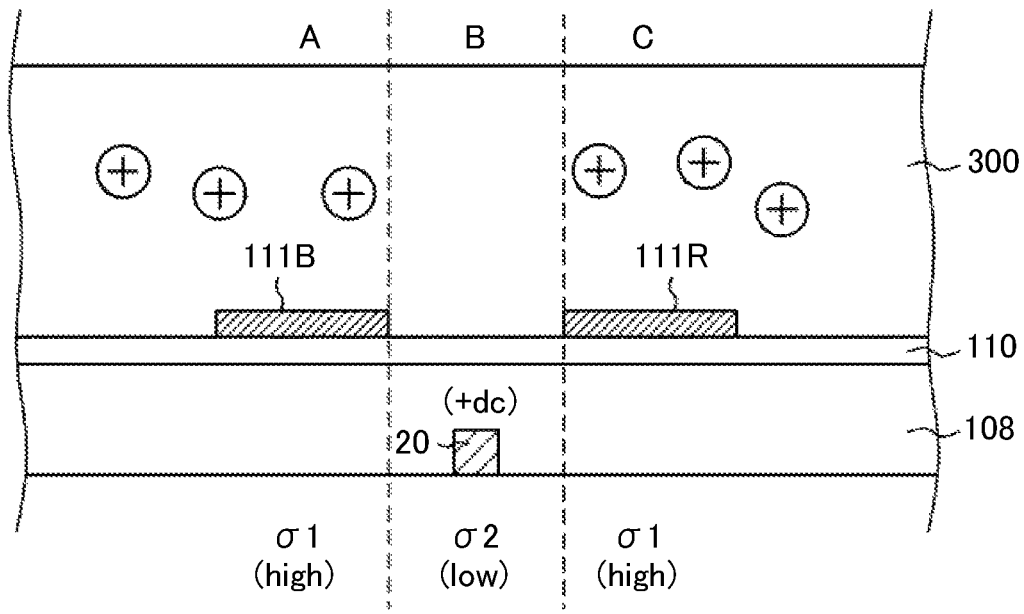
FIG. 7 is a cross sectional view that explains a mechanism of the image persistence.
Figure 8:
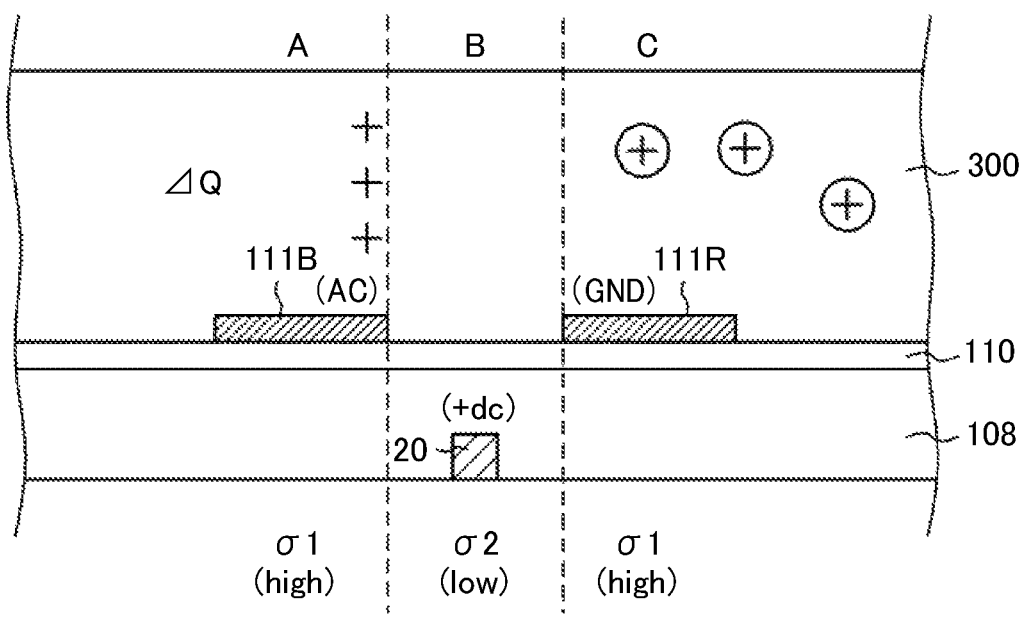
FIG. 8 is another cross sectional view that explains a mechanism of the image persistence.
Figure 9:
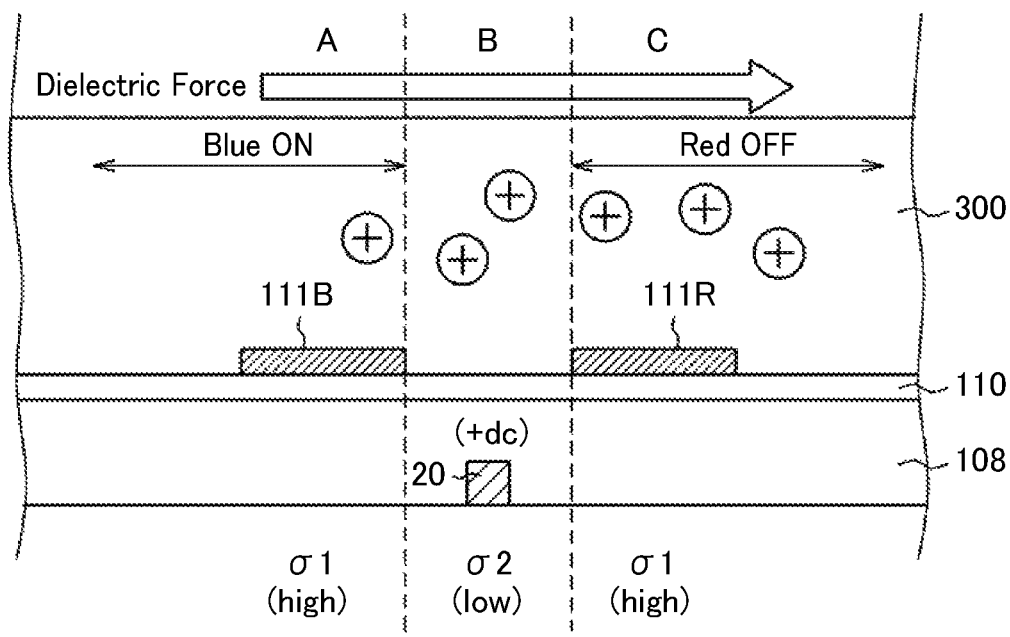
FIG. 9 is yet another cross sectional view that explains a mechanism of the image persistence.

The cause of this image persistence is explained using cross sectional models of FIGS. 7-9. FIGS. 7-9 correspond to cross sectional view along the line C-C of FIG. 3, however, to avoid complexity, FIG. 7-9 show only: the video signal line 20, the organic passivation film 108, the capacitive insulating film 110, the pixel electrode 111, and the liquid crystal 300. The notation "+" shows plus ion in FIGS. 7-9. The blue pixel 111B and the red pixel 111R are shown as the pixel electrode 111.

In FIG. 7, video signals are applied in alternative current (AC) with the amplitude of ΔV (e.g. 5V) and the center value of +Vdc (e.g. 0.3V). the center level is direct current (DC) voltage. The reason why the center value deviates by a value of +Vdc from a standard electric potential is to compensate the feed through voltage. The feed through voltage is produced when the voltage of the scanning line 10 changes from ON to OFF. The feed through voltage has an effect to reduce the electric potential of the pixel electrode due to parasitic capacitance Cgs between the gate electrode 105 and the source electrode S. Under this circumstance, at the outset, a distribution of ions in stable condition is considered, then, a perturbation of ions is considered when AC voltage is applied.

FIG. 7 shows the distribution of ions when only DC voltage is applied to the video signal line, where a response of ions when AC voltage is applied is not considered. Namely, FIG. 7 shows that DC voltage is not applied to the blue pixel electrode 111B and the red pixel electrode 111R; and +DC voltage is applied to only the video signal line 20. In the liquid crystal layer of FIG. 7, the area corresponds to the blue pixel 111B is A, the area corresponds to the video signal line 20 is B, and the area corresponds to the red pixel 111R is C.

In this state, plus ions distribute in the area of A corresponding to the blue pixel 111B and in the area of C corresponding to the red pixel 111R, not in the area B, which is in a plus voltage caused by a leak field from the video signal line 20. Then, the conductance σ1 of the liquid crystal in the areas A and C becomes bigger than the conductance σ2 of the liquid crystal in the areas B because of the influence of the ions. In the meantime, in this state, the distribution of ions is stable and there is no flow of ions in a certain direction.

Deviation of distribution of ions from the stable state when AC voltage is applied is defined as a perturbation. FIGS. 8-9 show the area of the Blue stripe 7B. In this state, the pixel electrodes 111R are OFF while the pixel electrodes 111B are ON. Since the liquid crystal is AC driven, AC voltage is applied to the blue pixel electrodes 111B while the ground voltage is applied to the red pixel electrodes 111R. Consequently, a field formed by "+" voltage is generated caused by AC voltage above the pixel electrode 111B. Under this circumstance, among several kinds of ions, which disproportionally distribute, only ions having high response respond to the AC voltage. Thus, a charge density ΔQ (ΔQ is also defined by surface charge herein after) is induced between the area A and the area B.

The charge density ΔQ (surface charge) is defined by complex number as that:

$$\Delta Q = \frac{\varepsilon}{\sigma + i\varepsilon\omega} \nabla \sigma E$$

where AC frequency is ω, σ2=σ, σ1−σ2=Δσ, ε=dielectric constant, E is an amplitude of AC voltage, i is an imaginary part.

The induced charge density ΔQ cannot follow thoroughly to the AC field formed by AC voltage, thus, a delay occurs. The dielectric force F that is formed by mutual interaction between the interface charges and the AC voltage is expressed in time average <F> as that:

$$<F> = <Q \cdot E> \propto -\Delta\sigma^* E^2$$

<F< is proportional to a square of E, and is formed in a direction of that σ1(big)→σ2(small) continuously. Namely, the electric force applied to ions is a force from the high conductance area A (conductivity σ1) to the low conductance area B (conductivity σ2) as depicted white arrow in FIG. 9. Therefore, when the AC voltage signal is applied, the force is generated to make ions flow e.g. toward the area above the video signal line 20 in the blue stripe 7B (from left to right in FIG. 9) no matter whether the AC voltage is applied in the positive frame or in the negative frame.

On the contrary, since a voltage is not applied to the red pixel electrode 111R, the phenomenon that occurs at the interface between the area A and the area B doesn't appear in the interface between the area B and C. Namely, in the blue stripe area 7B, a force that moves plus ions from the area A to the area B continuously exists.

When ions continuously flow in the area B, ions are accumulated, then, the accumulated ions diffuse to the area C. There are many sets of subpixels of blue, red and green in the blue stripe area 7B, the above explained phenomenon occurs in each of the set of the subpixel, thus, ions continuously flow from left to right in FIG. 9.

In the meantime, the phenomenon explained in FIGS. 7-9 occurs in the red stripe area 7R; in this area, however, the flow of ions is a reverse direction from the one explained in the FIGS. 7-9. Referring to FIG. 5, ions 5 flow in right direction in the blue stripe area 7B, while ions 5 flow in left direction in the red stripe area 7R. Thus, ions 5 accumulate at the interface between the blue stripe 7B and the red stripe R.

The area that ions accumulate is an interface where the blue stripe 7B is left and the red stripe 7R is right. Therefore, when the screen is changed from stripe patterns of blue and red to e.g. white pattern all over the screen, the image persistence by ions 5 occurs at the interface between the blue stripe 7B and the red stripe 7R.

In FIG. 3, the opening area of the common electrode 109 does not contribute to the display; thus, the area is covered by the black matrix 202. Therefore, the image persistence in the area is supposedly not conceivable even if the image persistence actually occurs. However, once a flow of ions occurs even in a part in the display area, it influences other areas where the black matrix doesn't cover since the influence propagates through the liquid crystal layer 300; consequently, it influences all the display area. As a result, it causes the image persistence depicted in FIG. 6.

The above phenomenon is caused by a non-uniformity of the conductance in the liquid crystal layer 300 due to a voltage applied to the video signal line 20. Therefore, the flow of ions can be avoided if the voltage of the video signal line 20 is thoroughly shielded.

In FIG. 3, the video signal line 20 in the left of the left pixel is overlapped by the common electrode 109 and the common metal wiring 30, similarly, the video signal line 20 in the right of the right pixel is overlapped by the common electrode 109 and the common metal wiring 30. Since the common electrode 109 and the common metal wiring 30 are located between the video signal line 20 and the liquid crystal layer 300, the common electrode 109 and the common metal wiring 30 can shield the influence of the field generated by the video signal line 20. Such an electrode or a wiring may be called a shield wiring in this specification.

By the way, the shield wiring can be formed by the conductive films as that the first ITO, which constitutes common electrode 109, or by the second ITO, which constitutes the pixel electrode, as well as the common metal wiring 30.

However, even a shield wiring is formed above the video signal line 20, if the shield wiring is partially deviated from the video signal line 20 in a plan view, non-uniformity in the potential occurs, thus, deviation in ion distribution occurs. Accordingly, non-uniformity of the conductance in the liquid crystal layer is generated, thus, the accumulation of ions occurs as explained by FIGS. 7-9, specifically in an area where strong leak voltage between the pixels exists.

Figure 10:
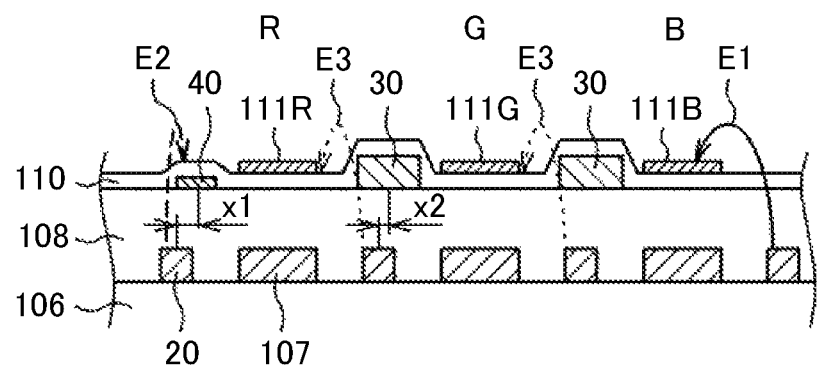
FIG. 10 is a cross sectional view that shows influence of the video signal lines.

FIG. 10 is a cross sectional view corresponding to FIG. 3 along the line C-C. The meaning of "corresponding" is that FIG. 10 doesn't correspond to FIG. 3 by 1:1. Layers not necessary for the explanation are omitted in FIG. 10 to avoid complexity.

In FIG. 10, the video signal line 20 and the contact electrode 107 are formed on the interlayer insulating film 106. The organic passivation film 108 is formed on the contact electrode 107, which is formed on the interlayer insulating film 106. Shield wirings are formed on the organic passivation film 108. The capacitive insulating film 110 is formed on the shield wiring. The pixel electrodes of 111B, 111G and 111R are formed on the capacitive insulating film 110.

In FIG. 10, the common metal wiring 30, and the first ITO 40, which is simultaneously formed with the common electrode 109, have a role of the shield wirings. As depicted in FIG. 10, the center of the shield wiring and the center of the video signal line 20 deviate from each other in the recent products due to a layout requirement in the high definition screen.

In addition, widths of shield wirings are different; in the case of FIG. 10, a width of the common metal wiring 30 is wider than the width of the shield wiring formed by the first ITO 40. Thus, the deviations differ from wiring to wiring as that; the deviation between the video signal line 20 and the shield wiring formed by the first ITO 40 is x1, while the deviation between the video signal line 20 and the shield wiring formed by the common metal wiring 30 is x2. As described above, even the field fin the video signal wiring is shielded by the shield wiring to some extent, the shield effect differs according to the amount of the deviation; consequently, an amount of the leak field in the liquid crystal layer differs from pixel to pixel.

In FIG. 10, the leak field from the video signal line 20 is described by the arrows. The strength of the leak field is in order that: E1>E2>E3. In this case the leak fields at the left hand side of the red pixel and the right hand side of the blue pixel are the stronger. If there is an imbalance in the leak field from the video signal line 20, and the leak field in a boundary of certain pixels (the boundary between the blue pixel and the red pixel as shown in FIGS. 7-9 in this embodiment) continuously exists, a current of ions in a certain direction occurs when stripes shown in FIG. 5 are displayed; consequently, the accumulations of ions occur, thus, the image persistence appears.

The difference of the deviations between the shield wiring and the video signal line in different boundaries has become more severe due to recent trend of the high definition screen. The reason is that the pixels become smaller according to the high definition display advances. The flow of ions has not been considered before, thus, symmetry in a plan view between the video signal line 20 and the shield wiring has been neglected.

To avoid the flow of ions, it is most preferable to make the protrusion of the shield wiring from the video signal line 20 uniform in all the shield wirings (the width of the shield wiring is bigger than a width of the video signal line 20 as a premise). If there happens to exist that areas where the shield wiring cannot be set, those areas should not be limited in boundaries of the same combination between the color pixels.

Figure 11:
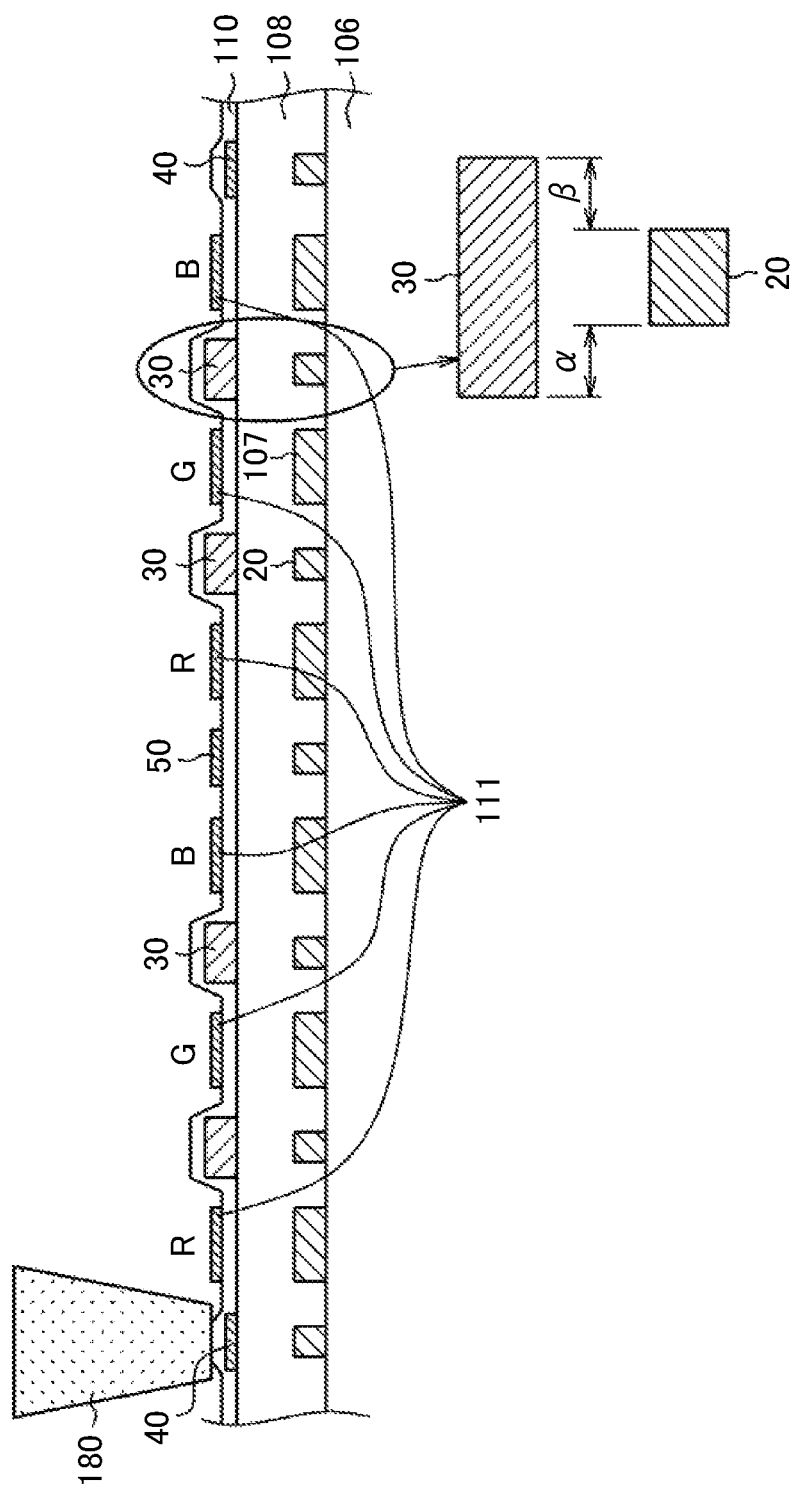
FIG. 11 is a cross sectional view that shows the structure of the present invention.

The below are concrete examples in this embodiment. FIG. 11 is a cross sectional view of the pixel structure of the present invention. FIG. 11 is a cross sectional view corresponding to FIG. 3 along the line C-C. The meaning of "corresponding" is that FIG. 11 doesn't correspond to FIG. 3 by 1:1. In FIG. 11, the video signal line 20 and the contact electrode 107 are formed on the interlayer insulating film 106. The organic passivation film 108 is formed on the contact electrode 107, which is formed on the interlayer insulating film 106. The shield wirings are formed on the organic passivation film 108. The capacitive insulating film 110 is formed on the shield wirings. The pixel electrodes 111 or the shield wirings are formed on the capacitive insulating film 110. The width of the pixel electrode 111 is approximately the same as the width of the contact electrode 107.

The feature of FIG. 11 is that the center of the shield wiring in the width direction is the same as the center of the video signal line 20 in the width direction. The lower figure of FIG. 11 is an enlarged figure of this structure. In the enlarged figure of FIG. 11, $\alpha=\beta$; each of $\alpha$ and $\beta$ are bigger than zero. If there exists a difference between $\alpha$ and $\beta$, the difference should be 2 μm or less. In this case the difference between the center of the video signal line 20 and the center of the shield wiring is 1 μm or less. More preferably, the difference is 1.5 μm or less. In this case the difference between the center of the video signal line 20 and the center the shield wiring is 0.75 μm or less.

When the pixel pitch becomes less, sometimes it becomes difficult to set the shield wirings by the same kind of wirings over the video signal lines 20 due to layout requirement. The present invention solves this problem by forming the shield wirings by three kinds of wirings, namely, the common metal wiring 30, the first ITO 40 and the second ITO 50. For example, the columnar spacer 180 is used to determine the distance between the TFT substrate 100 and the counter substrate 200. In this area, the common metal electrode 30 is not used but the first ITO 40 is used as the shield wring.

Sometimes it is difficult to form all the shield wirings in the same layer. The structure of FIG. 11 solves the problem by that: forming a part of shield wirings by the second ITO 50, which is simultaneously formed with the pixel electrode and on the same layer as the pixel electrode 111. The shield wiring formed on the same layer as the pixel electrode 111 is insulated from the pixel electrode 111. The shield electrode is, e.g., connected with the common electrode 109 via a through hole formed in the capacitive insulating film 110.

Figure 12:
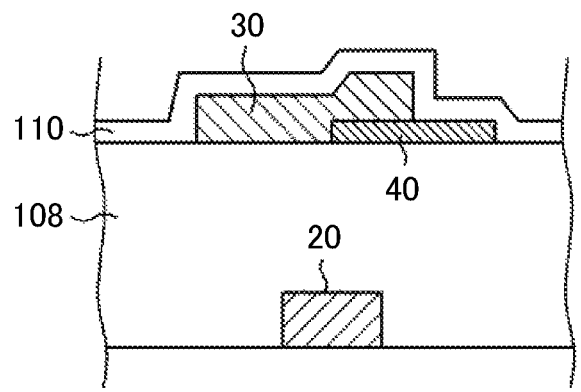
FIG. 12 is a cross sectional view that shows the structure of the shield wiring.

The shield wiring covering the video signal line 20 is not necessarily formed only by one layer but can be formed by plural layers according to a requirement of layout. FIGS. 12-16 are examples when the shield wirings are formed by plural layers. In FIG. 12, the organic passivation film 109 is formed on the video signal line 20, the shield wiring is formed on the organic passivation film 108, covering the video signal line 20. The shield wiring is a laminated film of the first ITO 40 and the common metal wiring 30. The width of the shield wiring is widened by laminating two layers.

Figure 13:
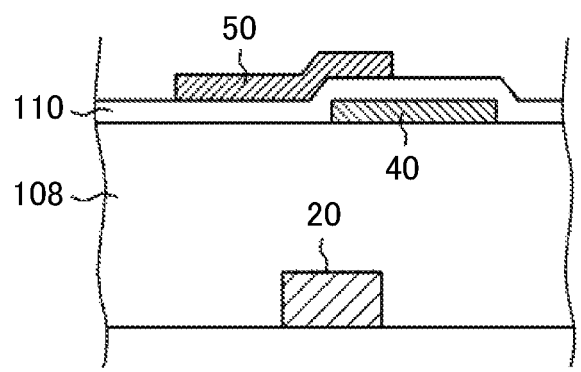
FIG. 13 is another cross sectional view that shows the structure of the shield wiring.

FIG. 13 is a structure that the organic passivation film 108 is formed on the video signal line 20. The video signal line 20 is covered by the first ITO 40, which is formed on the organic passivation film 108, and by the second ITO 50; the insulating layer 110 exists between the first ITO 40 and the second ITO 50. The first ITO 40 and the second ITO 50 are electrically connected at a different place. The width of the shield wiring is widened by using two layers.

Figure 14:
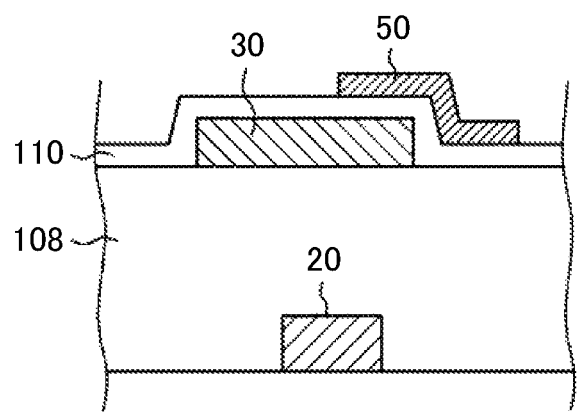
FIG. 14 is yet another cross sectional view that shows the structure of the shield wiring.

FIG. 14 is a structure that the organic passivation film 108 is formed on the video signal line 20. The video signal line 20 is covered by the common metal wiring 30, which is formed on the organic passivation film 108, and by the second ITO 50; the insulating layer 110 exists between the common metal wiring 30 and the second ITO 50. The common metal wiring 30 and the second ITO 50 are electrically connected at a different place. The width of the shield wiring is widened by using two layers as the shield wiring.

Figure 15:
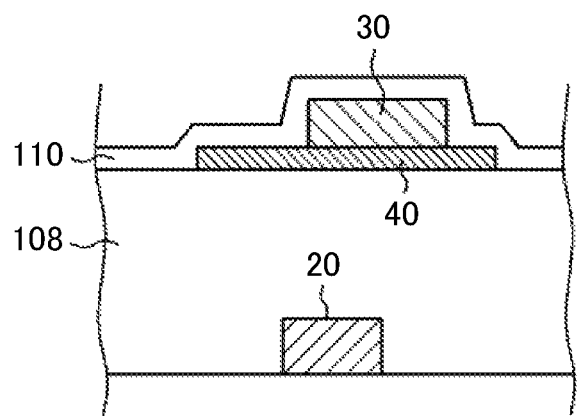
FIG. 15 is yet another cross sectional view that shows the structure of the shield wiring.

FIG. 15 is a structure that the organic passivation film 108 is formed on the video signal line 20. The video signal line 20 is covered by the first ITO 40, which is formed on the organic passivation film 108, and by the common metal wiring 30. FIG. 15 is an example that the electrical resistance of the shield wiring is decreased by laminating the common metal wring on the first ITO 40.

Figure 16:
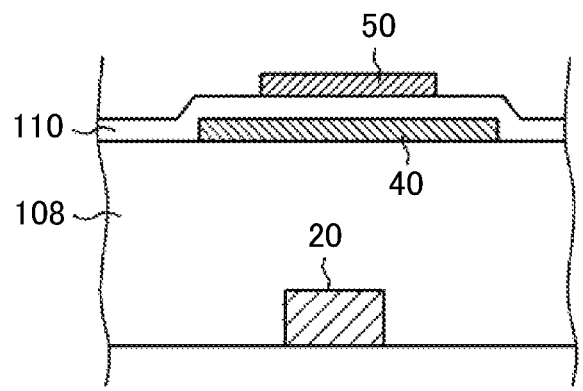
FIG. 16 is yet another cross sectional view that shows the structure of the shield wiring.

FIG. 16 is a structure that the organic passivation film 108 is formed on the video signal line 20. The video signal line 20 is covered by the first ITO 40, which is formed on the organic passivation film 108, and by the second ITO 50; the insulating layer 110 is between the first ITO 40 and the second ITO 50. The first ITO 40 and the second ITO 50 are electrically connected at a different place. FIG. 16 differs from FIG. 13 in that the width of the first ITO 40 is bigger than the width of the second ITO 50 the second ITO 50 is in the width of the first ITO 40. Contrary to FIG. 16, the width of the second ITO 50 can be bigger than the width of the first ITO 40.

As described above, the video signal line 20 is covered by the shield wiring symmetrically in right and left, thus, imbalance of the influence of the video signal line 20 is suppressed. Consequently, movement of ions is suppressed and the accumulation of ions in certain place is avoided. Thus, the image persistence can be suppressed.

Second Embodiment

Figure 17:
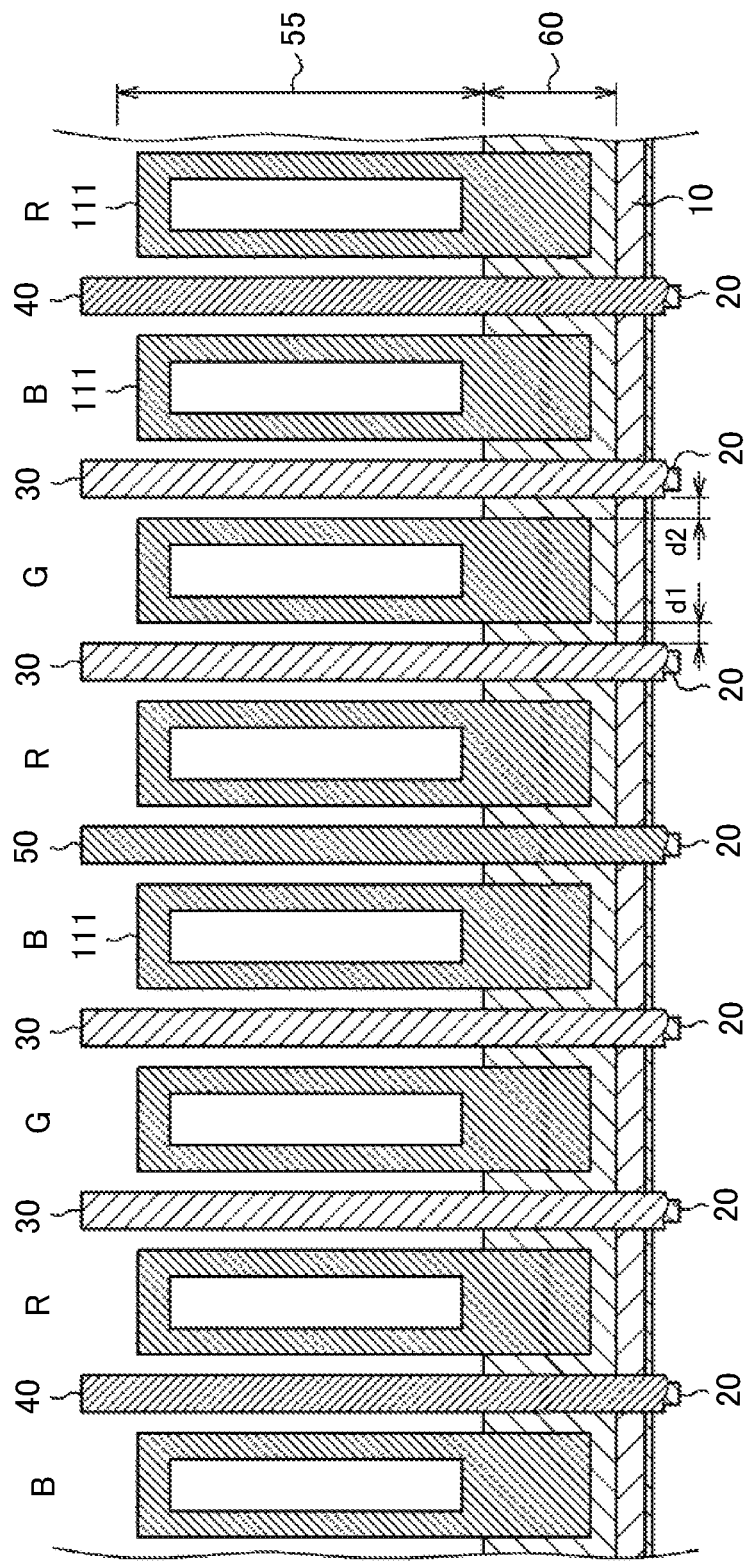
FIG. 17 is a plan view that shows the pixel structure in the second embodiment.

FIG. 17 is a plan view of the second embodiment. In FIG. 17, the scanning line 10 extends in lateral direction and the video signal lines 20 extend in longitudinal direction crossing the scanning line 10. The video signal lines are covered by the shield wirings. The insulating layer like the organic passivation layer is formed between the video signal lines and the shield wirings as explained in the first embodiment.

In FIG. 17, the shield wirings are formed by the first ITO 40, the second ITO 50 or the common metal wiring 30, etc. according to the positions. The shield wiring can be a laminated film as explained by FIGS. 12-16.

The pixel including the pixel electrode 111 is formed between the video signal line 20 and the adjacent video signal line 20. The first area of the pixel electrode 111 has two comb teeth with a slit between the comb teeth. The pixel electrode in FIG. 17 is an example; in other cases, the comb teeth can be one or three or more.

In FIGS. 17 to 21, the center of the shield wiring and the center of the video signal line 20 coincide, thus, the area between the shield wiring and the adjacent shield wiring can be defined as a pixel. The pixel can be divided, in a plan view, into a driving area where the pixel electrode 111 drives the liquid crystal layer 300 to contribute for display, and a contact area where the pixel electrode 111 connects with the TFT. The driving area is called the first area 55 and the contact area is called the second area 60. In the first area 55, the common electrode 109 is formed in plural pixels in common in lateral direction. This, the video signal line 20 is shielded by the common electrode in the first area 55.

On the contrary, in the second area 60 of the pixel, in a display area of high definition display like FIG. 3, the area that common electrode 109 doesn't overlap with the video signal line 20 increases, thus, this area is easily influenced by the field fluctuation due to potential changes of the video signal lines 20. In embodiment 1, the influence of the video signal lines is suppressed by shield wirings. However, sometimes it is difficult to form all the shield wirings in the same width and to overlap the video signal lines in the same manner because of the layout requirement. Even in this situation, the present embodiment countermeasures the influence of the field from the video signal lines 20 by the structure of the pixel electrode 111.

Concretely, as depicted in FIG. 17, the structure is that: making the distance d1 between the pixel electrode 111 and the first shield line coincide with the distance d2 between the pixel electrode 111 and the second shield line, which is in opposite side to the first shield line, thus, the influences from the video signal lines can be made equal at the left side and the right side of the pixel electrode ill. Consequently, the imbalance of the leak field from the video signal lines 20 can be suppressed.

There could be a difference between d1 and d2 due to the layout requirement or the manufacturing err; even in this case, the difference is preferably 2 μm or less and more preferably, 1.5 μm or less. Unlike FIG. 17, when the figure of the pixel electrode 111 in the second area 60 does not extend straight in the direction of the shield line extends, d1 or d2 can be defined as a distance between a portion of the pixel electrode that is longest in parallel to the shield wiring and the shield wiring.

Figure 18:
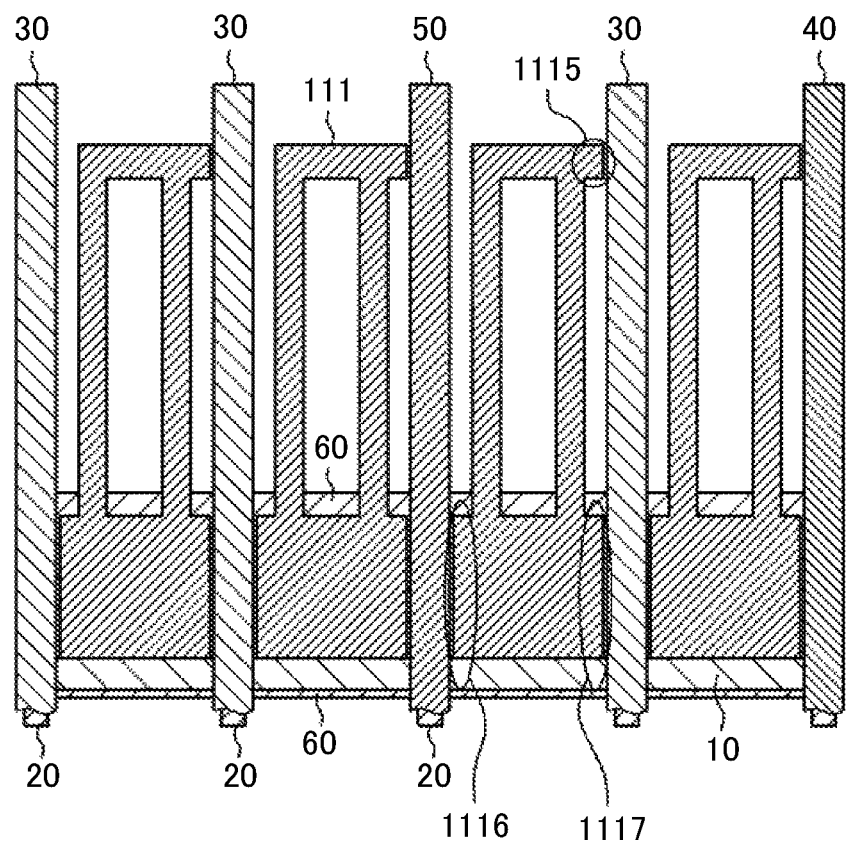
FIG. 18 is another plan view that shows the pixel structure in the second embodiment.

FIG. 18 is a plan view of a second example of the second embodiment. Although the number of the pixels in FIG. 18 is less than the number of the pixels in FIG. 17 the structure is the same as the case of FIG. 17 in that the first ITO 40, the second ITO 50 and the common metal wiring 30 are used for the shield wirings. The projection 1115 is formed in the right direction of the pixel electrode 111 in the driving area 55 of the pixel, namely, the pixel electrode 111 is imbalance between the left side and the right side. The projection in the right direction is formed to quickly dissipate the press domain, which is formed when the liquid crystal panel is pushed by a finger.

In FIG. 18, even though the pixel electrode 111 in the first area 55 is imbalance in left and right, the pixel electrode 111 in the second area 60 has extension areas 1116, 1117 in left and right in symmetry. In other words, the distance between the pixel electrode 111 and the shield wiring is the same at the both sides of the pixel electrode 111. This, the influence of the video signal lines can be balanced in left and right of the pixel electrode 111; consequently, the flow of ions when stripe pattern is displayed can be suppressed.

In the meantime, in the first area 55 of the pixel, the figure of the pixel electrode 111 is left-right asymmetry; however the influence of the video signal lines is shielded because the video signal lines are covered by the common electrode 109 that extends in lateral direction in the first area 55. Thus, a flow of ions due to the left-right imbalance of the pixel electrode 111 doesn't occur.

Figure 19:
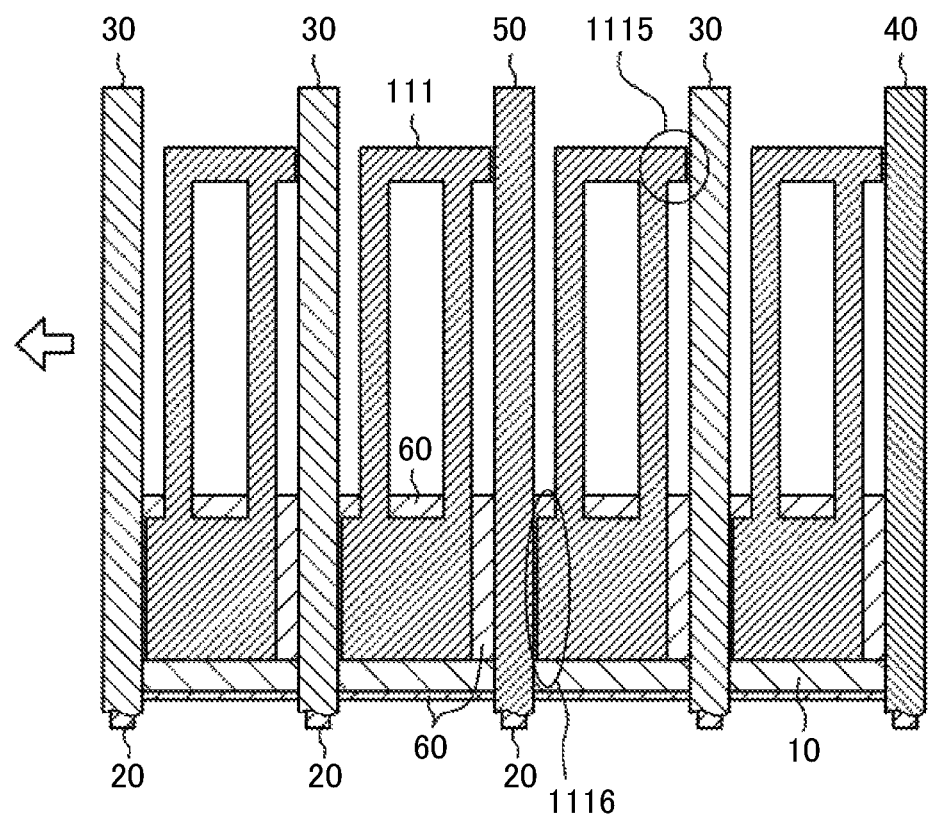
FIG. 19 is yet another plan view that shows the pixel structure in the second embodiment.

FIG. 19 is a plan view of a third example of the second embodiment. FIG. 19 is the same as FIG. 18 in that the first ITO 40, the second ITO 50 and the common metal wiring 30 are used for the shield wirings. The pixel electrode 111 of FIG. 19 is the same as FIG. 18 in that the projection 1115 is formed in the right direction for the pixel electrode 111 in the driving area of the pixel, namely, the pixel electrode is imbalance between the left side and the right side.

FIG. 19 differs from FIGS. 17 and 18 in that the pixel electrode 111 has only the extension 1116 in the second area 60 of the pixel. Consequently, there is an area where the distance between the pixel electrode 111 and the shield wiring is big in the second area 60 of the pixel. In FIG. 19, however the center of the contact area of the pixel electrode 111 deviates to the left side in all the pixels, thus, the direction of the flow of the ions is the same in all the pixels. Therefore, ions are not accumulated in a specific area of the screen; consequently, the image persistence doesn't occur. Namely, in the structure of FIG. 19, a flow of ions may occur, however, ions don't accumulate in certain area of the display area, thus, the image persistence doesn't occur. Ions may accumulate in an area outside of the display area however this accumulation of ions doesn't deteriorate the image quality.

Figure 20:
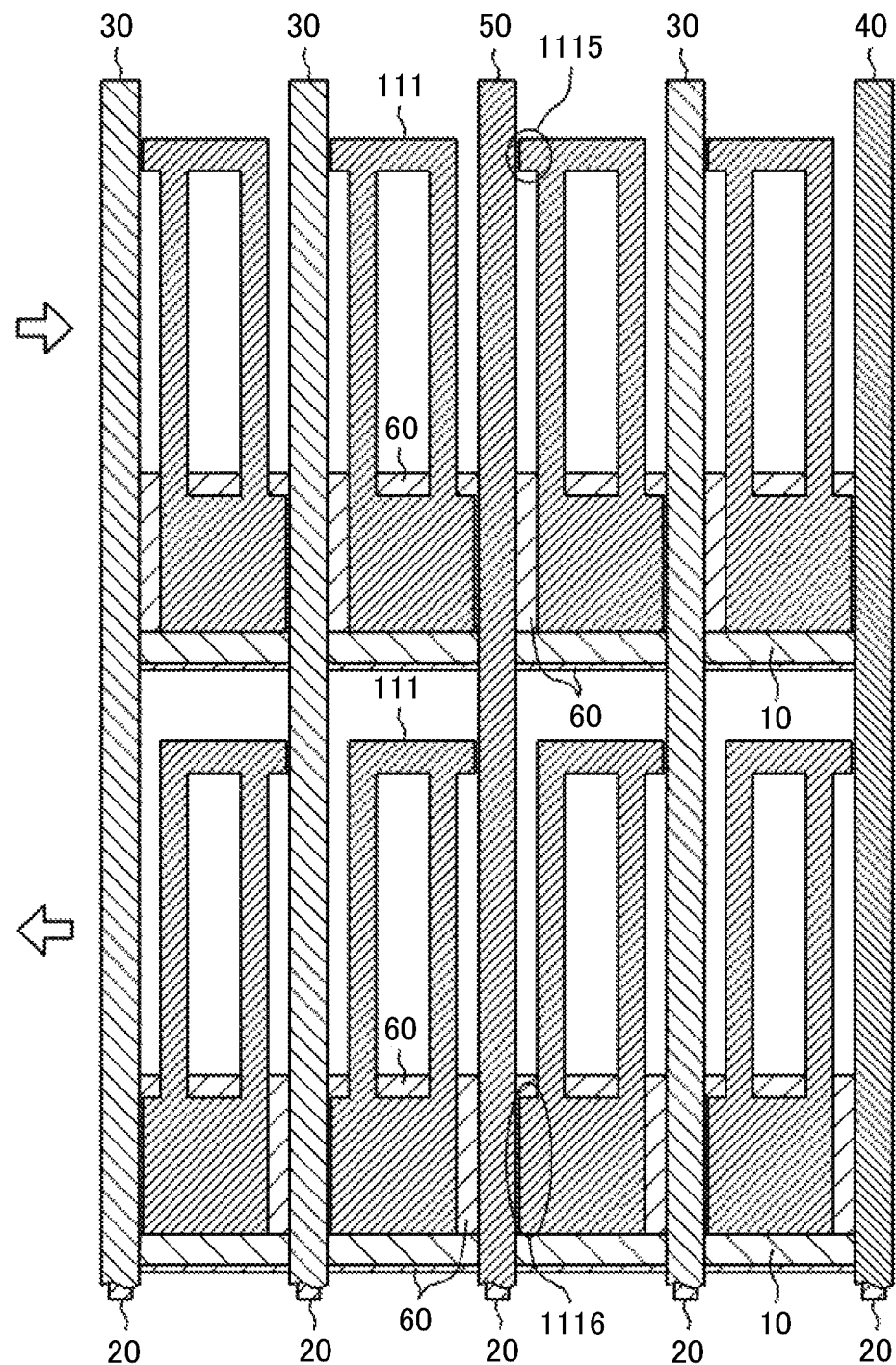
FIG. 20 is yet another plan view that shows the pixel structure in the second embodiment.

FIG. 20 is a plan view of a fourth example of the second embodiment. FIG. 20 shows two pixel rows. The upper row is called the first pixel row and the lower row is called the second pixel row. The second pixel row is the same as explained in FIG. 19. On the contrary, in the first pixel row in FIG. 20, the projection 1115 and the extension 1116 are formed in opposite direction compared with the second pixel row.

In the structure of FIG. 20, when the stripe pattern as FIG. 5 is displayed, the flows of ions occur, however, in reverse directions between the first pixel row and the second pixel row. Since the liquid crystal has viscosity, the force in the first pixel row influences the force in the second pixel row. Namely, the force that moves ions in the first pixel row works to hinder the force that moves ions in the second pixel row, and vice versa; thus, the flow of ions is reduced in both pixel rows.

According to the structure of FIG. 20, the flow of ions can be reduced, and further, even if the flow of ions occurs, the ions accumulate outside of the display area. Therefore, the image persistence is suppressed.

Figure 21:
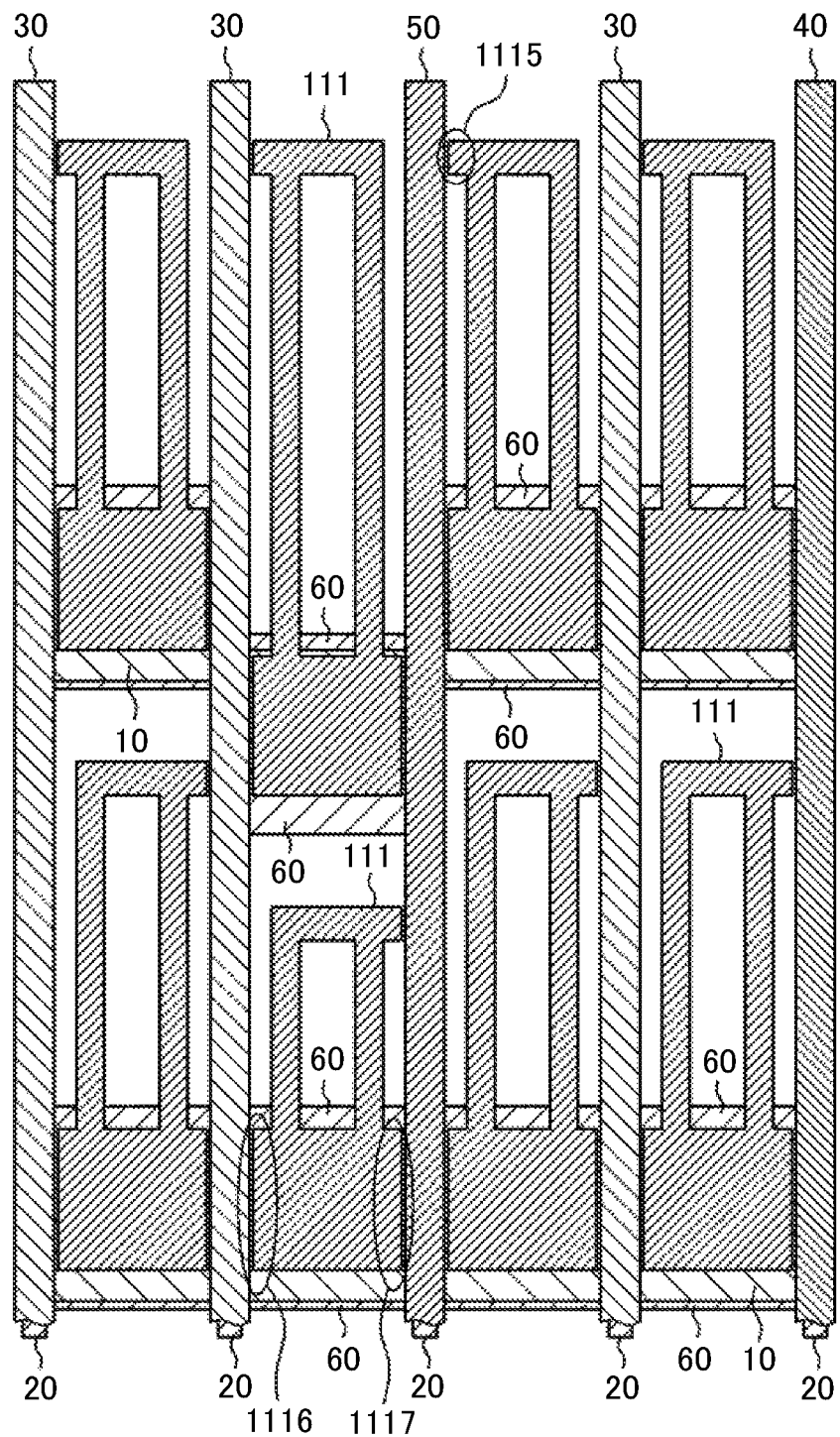
FIG. 21 is yet another plan view that shows the pixel structure in the second embodiment.

FIG. 21 is a plan view of a fifth example of the second embodiment. FIG. 21 also shows two pixel rows. The upper row is called the first pixel row and the lower row is called the second pixel row. There is a pixel that is elongated in longitudinal direction in the first pixel row while there is a pixel that is shortened in longitudinal direction in the second pixel row. Such configuration can be adopted to adjust brightness in e.g. a display that has four color filters of Red, Blue, Green and White, which white pixel is added to normal red pixel, blue pixel and green pixel.

In FIG. 21, in the first area 55 of the pixel, the common electrode 109 extends laterally in plural pixels in common in a plan view. The shield wirings that separate pixels are the same as explained in FIG. 18. In FIG. 21, in the second area 60 of the laterally elongated pixel the pixel area has extensions 1116 and 1117 in left and right side symmetrically.

In FIG. 21, even if the field is not completely shielded, the leak field is symmetry, thus, the flow of ions can be suppressed. Consequently, the image persistence due to the accumulation of ions can be suppressed. In FIG. 21, in the pixel that is shrunk in lateral direction, the pixel electrode is formed symmetrically in left and right in the second area 60, the flow of ions can be avoided. Thus, the image persistence due to the accumulation of ions can be suppressed.

In FIGS. 17-21 of the present embodiment, the symmetry in the second area 60 of the pixel is defined by the difference between d1 and d2. The symmetry can be defined as the difference between the center of the contact area of the pixel electrode in the direction the scanning line extends and the center of the area sandwiched by two shield wirings.

In this definition, in FIGS. 17, 18 and 21, the difference between the center of the contact area of the pixel electrode in the direction of the scanning line and the center of the second area of the pixel in the direction of the scanning line is 1.0 µm or less, and more preferably, 0.75 µm or less. On the contrary, in this definition, in FIGS. 19 and 20, the difference is 1.5 µm or more.

What is claimed is:
1. A liquid crystal display device comprising:
a first substrate and a second substrate,
a liquid crystal layer sandwiched between the first substrate and the second substrate,
the first substrate having; scanning lines extending in a first direction and arranged in a second direction,
videos signal lines arranged to cross the scanning lines,
a pixel area surrounded by the scanning lines and the video signal lines, and
a pixel electrode formed in the pixel area,
wherein the first substrate has conductive wirings between the video signal line and the liquid crystal layer in cross sectional view, at least an organic insulating film is formed between the conductive wiring and the video signal line,
the conductive wirings are formed over the video signal lines in a plan view, a width in the first direction of one of the conductive wirings is larger than a width in the first direction of one of the video signal lines, the one conductive wiring has edges on both sides extending in the second direction, the one video signal line has edges on both sides extending in the second direction, and an amount of the one conductive wiring that extends beyond the edges of the one video signal line to the edges of the one conductive wiring in a plan view is essentially the same on both sides of the one video signal line.

2. The liquid crystal display device according to claim 1, wherein the pixel area has a switching element, the pixel electrode connects with the switching element in the connecting area of the pixel area, and a space between the pixel electrode and the conductive wiring in the connecting area is the same in all the pixel area in a display area.

3. The liquid crystal display device according to claim 1, wherein the conductive wiring has a first wiring and a second wiring, the first wiring and the second wiring are formed on different layers, and the first wiring and the second wiring are formed by ITO.

4. The liquid crystal display device according to claim 1, wherein the conductive wiring has a first wiring and a second wiring, the first wiring and the second wiring are formed on different layers, the first wiring is formed by metal or alloy, and the second wiring is formed by ITO.

5. The liquid crystal display device according to claim 1, wherein the conductive wiring has a first wiring and a second wiring, the first wiring is formed by plural wirings, and the plural wirings are directly laminated.

6. The liquid crystal display device according to claim 1, wherein the conductive wiring has a first wiring and a second wiring, the first wiring is formed by plural wirings, and the plural wirings are laminated via an insulating layer.

7. The liquid crystal display device according to claim 1, wherein a distance between the center of the video signal line and the center of the conductive wiring in the first direction is 1 μm or less.

8. A liquid crystal display device comprising:

scanning lines extending in a first direction and arranged in a second direction, a first video signal line and a second video signal line arranged to cross the scanning lines, a pixel formed between the first video signal line and the second video signal line, and a pixel electrode formed in the pixel, wherein a first shield wiring is formed above the first video signal line via a first insulating film, a second shield wiring is formed above the second video signal line via a first insulating film, the pixel electrode has driving area to drive liquid crystal and a contact area to contact with a TFT, the pixel includes a first area including the driving area of the pixel electrode, and a second area including the contact area of the pixel electrode, in the second area, the distance between the pixel electrode and the first shield wiring is d1, the distance between the pixel electrode and the second shield wiring is d2, and the difference between d1 and d2 is 2 μm or less.

9. The liquid crystal display device according to claim 8, wherein the difference between d1 and d2 is 1.5 μm or less.

10. The liquid crystal display device according to claim 8, wherein the driving area of the pixel electrode is asymmetrical in the first direction.

11. A liquid crystal display device comprising:

scanning lines extending in a first direction and arranged in a second direction, a first video signal line and a second video signal line arranged to cross the scanning lines, a pixel formed between the first video signal line and the second video signal line, and a pixel electrode formed in the pixel, wherein a first shield wiring is formed above the first video signal line via a first insulating film, a second shield wiring is formed above the second video signal line via a first insulating film, the pixel electrode has driving area to drive liquid crystal and a contact area to contact with a TFT, the pixel includes a first area including the driving area of the pixel electrode, and a second area including the contact area of the pixel electrode, in the second area, the distance between the pixel electrode and the first shield wiring is d1, the distance between the pixel electrode and the second shield wiring is d2, and in a first pixel row, the pixels are arranged in the first direction, an amount of d2−d1 is 1.5 μm or more in whole pixels in the first pixel row.

12. The liquid crystal display device according to claim 11, wherein the pixels are arranged in the first direction in a second pixel row, and an amount of d2−d1 is 1.5 μm or more in whole pixels in the second pixel row.

13. The liquid crystal display device according to claim 12, wherein the first pixel row and the second pixel row are adjacently located.

* * * * *